United States Patent
Zhou et al.

(10) Patent No.: US 7,443,677 B1
(45) Date of Patent: Oct. 28, 2008

(54) HEAT DISSIPATION DEVICE

(75) Inventors: Shi-Wen Zhou, Shenzhen (CN);
Chun-Chi Chen, Taipei Hsien (TW);
Guo Chen, Shenzhen (CN)

(73) Assignees: Fu Zhun Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/776,862

(22) Filed: Jul. 12, 2007

(51) Int. Cl.
*H05K 7/20* (2006.01)
*H01L 23/36* (2006.01)

(52) U.S. Cl. .............. 361/702; 361/687; 361/698; 361/699; 361/700; 361/704; 165/80.3; 165/80.4; 165/104.21; 165/104.33; 165/121; 165/185

(58) Field of Classification Search ............ 361/687, 361/698–704, 707–712, 715–721; 165/80.2, 165/80.3, 80.4, 104.21, 104.33, 121–126, 165/185; 257/713–715, 721–724; 62/259.2; 174/15.1, 15.2, 16.3, 252
See application file for complete search history.

(56) References Cited

U.S. PATENT DOCUMENTS

| | | | | |
|---|---|---|---|---|
| 6,808,013 B2 * | 10/2004 | Lai et al. | .......... | 165/80.4 |
| 6,918,429 B2 * | 7/2005 | Lin et al. | .......... | 165/80.3 |
| 7,013,960 B2 * | 3/2006 | Lee et al. | .......... | 165/104.33 |
| 7,100,681 B1 * | 9/2006 | Wu et al. | .......... | 165/104.33 |
| 7,110,259 B2 * | 9/2006 | Lee et al. | .......... | 361/700 |
| 7,296,617 B2 * | 11/2007 | Lee et al. | .......... | 165/80.3 |
| 7,331,379 B2 * | 2/2008 | Chen et al. | .......... | 165/104.33 |
| 2003/0019610 A1 * | 1/2003 | Liu | .......... | 165/80.3 |
| 2006/0289150 A1 * | 12/2006 | Lee et al. | .......... | 165/104.33 |
| 2007/0051501 A1 * | 3/2007 | Wu et al. | .......... | 165/104.33 |
| 2007/0095509 A1 * | 5/2007 | Lee et al. | .......... | 165/104.33 |
| 2008/0115914 A1 * | 5/2008 | Yang et al. | .......... | 165/104.33 |

* cited by examiner

*Primary Examiner*—Michael V Datskovskiy

(57) ABSTRACT

A heat dissipation device comprises a first heat sink (10) for thermally contacting with an electronic device, a second heat sink (20) mounted on the first heat sink, heat pipes (40) connecting with both the first and second heat sinks. The heat pipes surround an entire periphery of the first heat sink and a part of the second heat sink. Each heat pipe comprises an evaporating portion (42), a first condensing portion (46) and a second condensing portion (44). The first and second condensing portions extend from two opposite ends of the evaporating portion respectively. The evaporating portion is positioned adjacent to the electronic device and the two condensing portions extend inwardly and bend in opposite directions to each other. The first condensing portion extends through the first heat sink and the second condensing portion extends through the second heat sink.

17 Claims, 4 Drawing Sheets

US 7,443,677 B1

HEAT DISSIPATION DEVICE

BACKGROUND OF THE INVENTION

1. Field of the Invention

The present invention relates generally to a heat dissipation device, and more particularly to a heat dissipation device for cooling a heat-generating electronic device, having heat pipes configured for enhancing heat dissipation capability thereof.

2. Description of Related Art

Large amounts of heat are produced during operation of electronic devices such as central processing units (CPUs). The heat produced must be quickly removed to ensure normal operation of the CPU. Typically, a related heat dissipation device 50a with heat pipes 55a as shown in FIG. 4 is used to remove heat from the CPU. The related heat dissipation device 50a comprises a base 52a to absorb heat from an electronic device 51a, a plurality of fins 54a extending from the base 52a and heat pipes 55a. Each of the heat pipes 55a comprises an evaporator 552a engaging with the base 52a and two condensers 554a, 555a engaging with the fins 54a. During operation of the heat dissipation device 50a, the base 52a absorbs the heat from the electronic device 51a. One part of the heat is directly transferred to bottom portions of the fins 54a. The other part of the heat is transferred to middle and top portions of the fins 54a via the heat pipes 55a. However, the heat pipes 55a cannot be optimally utilized in the related heat dissipation device 50a due to the heat being transfer to the fins 54a via the heat pipes 55a in one direction only. Thus, heat dissipation efficiency of the heat dissipation device 50a is limited.

Therefore, it is desirable to provide a heat dissipation device having a high heat dissipation efficiency.

SUMMARY OF THE INVENTION

A heat dissipation device comprises a first heat sink thermally contacting with an electronic device, a second heat sink mounted on the first heat sink, at least one heat pipe connecting with both the first heat sink and the second heat sink. The at least one heat pipe surrounds an entire periphery of the first heat sink and comprises an evaporating portion, a first condensing portion and a second condensing portion. The first condensing portion and the second condensing portion extend from two opposite ends of the evaporating portion respectively. The evaporating portion is positioned adjacent to the electronic device and the two condensing portions extend inwardly and bend in opposite directions to each other. The first condensing portion extends through the first heat sink and the second condensing portion extends through the second heat sink.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
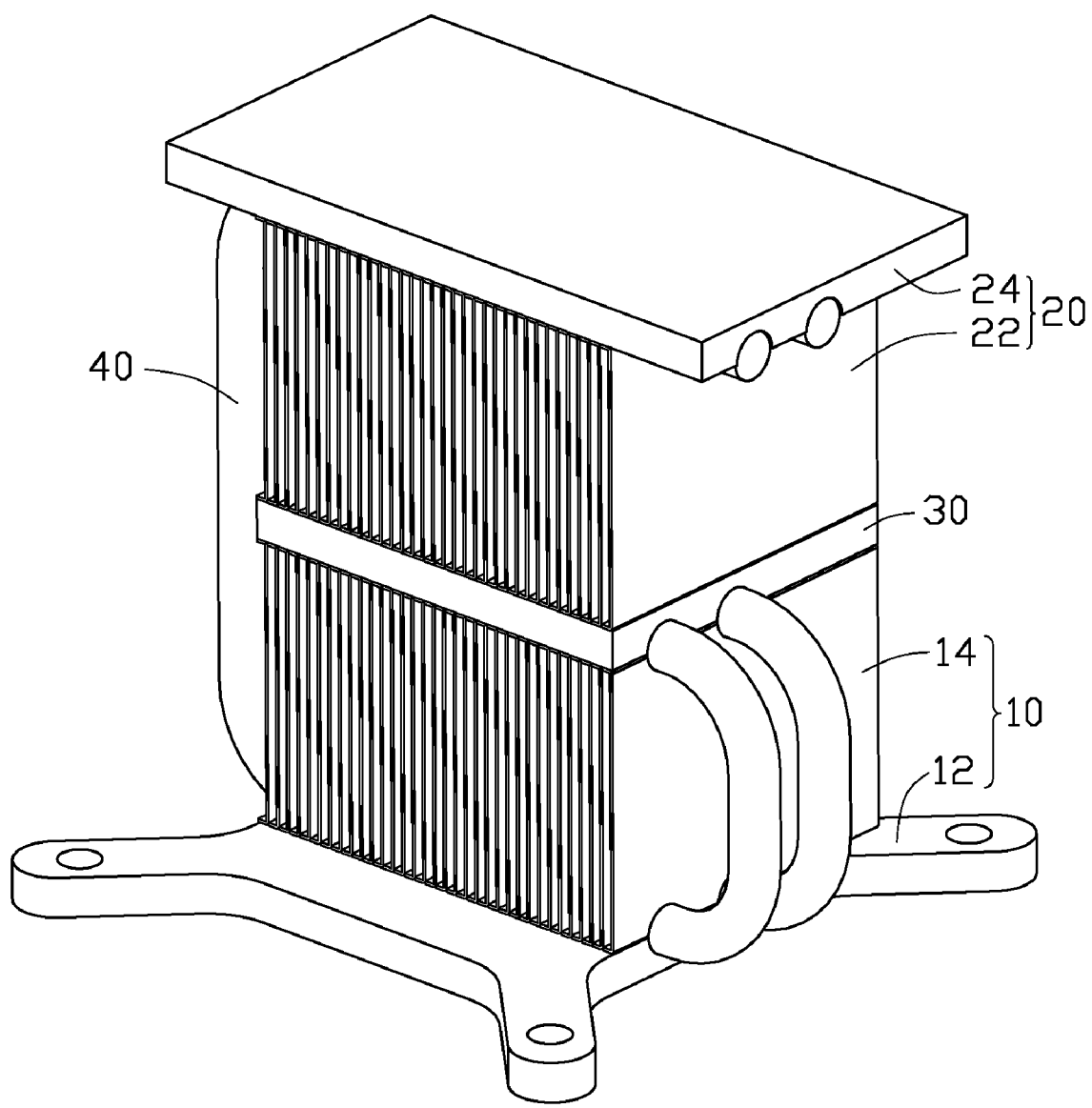
FIG. 1 is an assembled, isometric view of a heat dissipation device in accordance with a preferred embodiment of the present invention.
Figure 2:
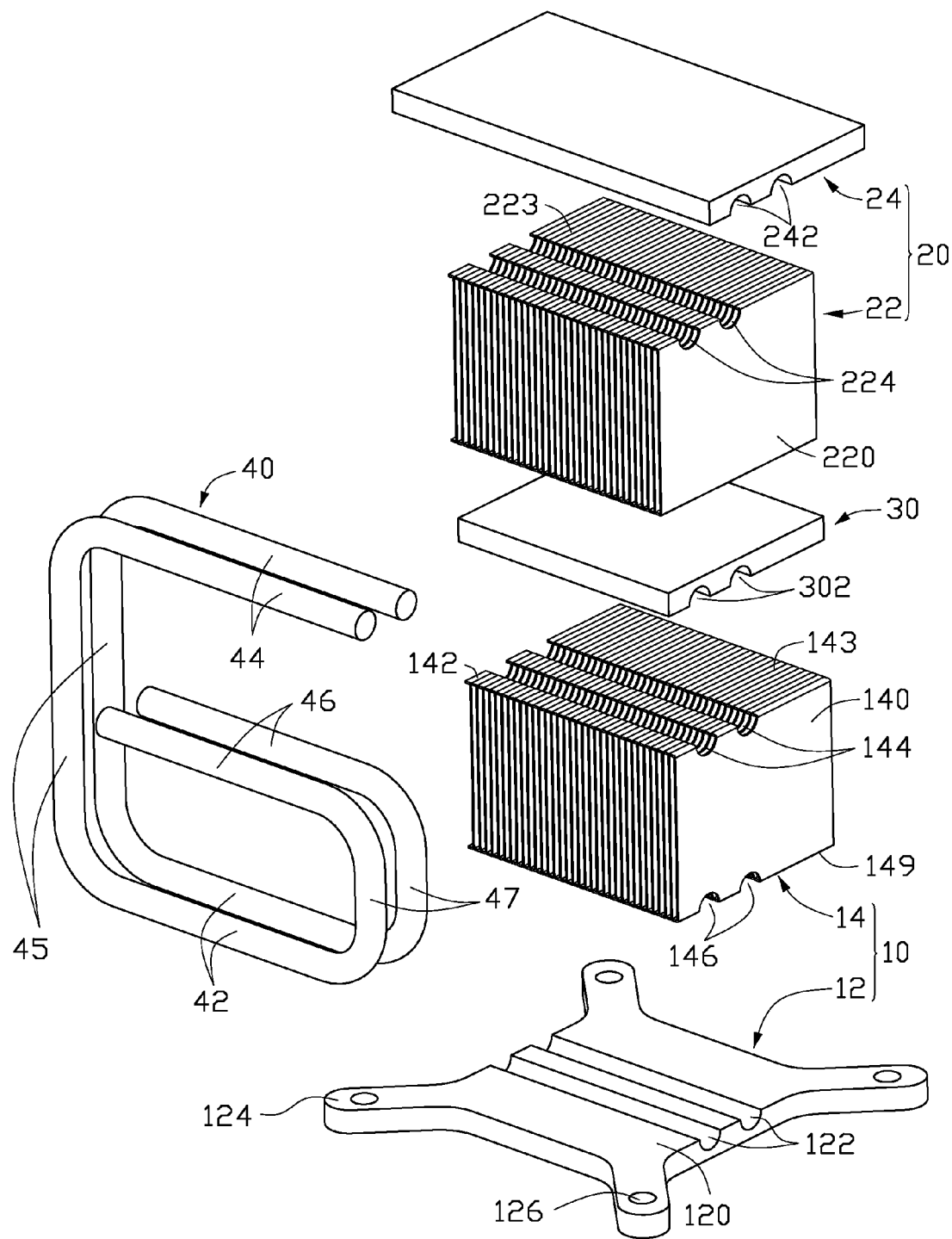
FIG. 2 is an exploded, isometric view of the heat dissipation device in FIG. 1.

Referring to FIG. 1 and FIG. 2, a heat dissipation device in accordance with a preferred embodiment of the present invention is mounted on a printed circuit board (not shown) to remove heat from a heat-generating electronic device (not shown) such as a CPU mounted on the printed circuit board. The heat dissipation device comprises a first heat sink 10, a second heat sink 20 above the first heat sink 10, a heat spreader 30 between the first heat sink 10 and the second heat sink 20, and two heat pipes 40 thermally connecting with the heat sinks 10, 20. The first heat sink 10 is mounted on and thermally contacts with the heat-generating electronic device.

The first heat sink 10 comprises a bottom board 12 and a plurality of fins 14 thermally attached to the bottom board 12. The bottom board 12 comprises a rectangular substrate 120 and four fastening ears 124 horizontally extending outwardly from four corners of the substrate 120 respectively. The bottom board 12 is made of a material having high heat conductivity, such as copper or aluminum. A bottom surface of the bottom board 12 contacts with the heat-generating electronic device to absorb heat therefrom. Two parallel grooves 122 are defined in a top portion of the substrate 120 for receiving parts of the heat pipes 40. The two grooves 122 are spaced close together, and located at a center of the substrate 120. Each of the fastening ears 124 has a hole 126 defined vertically therethrough. The holes 126 are used for a plurality of screws (not shown) to extend therethrough to mount the bottom board 12 on the printed circuit board. Each of the fins 14 comprises a rectangular plate 140. Two opposing sides 142 respectively extend outwards from upper and lower edges of the plate 140 along a direction perpendicular to the rectangular plate 140. The fins 14 are soldered to each other on the sides 142; thus, a top portion 143 and a bottom portion 149 of the fins 14 are formed. The bottom portion 149 of the fins 14 is used to thermally contact with a top portion of the bottom board 12 by soldering. The bottom portion 149 defines two parallel grooves 146 therein. The grooves 146 extend through the fins 14 in a longitudinal direction and cooperate with the grooves 122 of the bottom board 12 to form circular passages (not labeled) for receiving parts of the heat pipes 40. The top portion 143 of the fins 14 is used to thermally contact with a bottom portion of the heat spreader 30 by soldering. The top portion 143 defines two parallel grooves 144 therein. The grooves 144 extend through the fins 14 and are parallel to the grooves 146.

The heat spreader 30 is parallel to the bottom board 12 and mounted on the fins 14. The heat spreader 30 is rectangular. An area covered by the heat spreader 30 is essentially identical to the top portion 143 of the fins 14. Corresponding to the grooves 144 of the fins 14, two parallel grooves 302 are defined in a bottom portion of the heat spreader 30. The grooves 302 cooperate with the grooves 144 to form circular passages (not labeled) for receiving parts of the heat pipes 40. The bottom portion of the heat spreader 30 thermally contacts with the top portion 143 of the fins 14 by soldering and a top portion of the heat spreader 30 is used for thermally contacting with a bottom portion of the second heat sink 20 by soldering.

The second heat sink 20 is attached on the heat spreader 30. The second heat sink 20 comprises a plurality of fins 22 and a cover board 24 covering the fins 22. Each of the fins 22 has a similar shape with that of the fins 14. The difference between the fins 22 and the fins 14 is that only two parallel grooves 224 are defined in a top portion 223 of the fins 22. The cover board 24 is rectangular and made of a material having high heat conductivity. A bottom portion of the cover board 24 thermally contacts with the top portion 223 of the fins 22. An area covered by the cover board 24 is larger than that of the top portion 223 of the fins 22. Corresponding to the grooves 224 of the fins 22, two parallel grooves 242 are defined in the bottom portion of the cover board 24. The grooves 242 cooperate with the grooves 224 to form circular passages (not labeled) for receiving other parts of the heat pipes 40.

The two heat pipes 40 have essentially identical configurations with both having a "6" shape, as well as having essentially identical functions. Each of the heat pipes 40 has a horizontal, straight evaporating portion 42. A first connecting portion 47 and a second connecting portion 45 vertically extend from two ends of the evaporating portion 42 respectively. The two connecting portions 45, 47 are positioned in two lateral sides of the first heat sink 10 respectively. The second connecting portion 45 is longer than the first connecting portion 47. A first condensing portion 46 horizontally extends from an end of the first connecting portion 47 and towards the second connecting portion 45. The first condensing portion 46, the first connecting portion 47 and the evaporating portion 42 cooperatively form a U-shaped configuration, which has an opening oriented towards a first direction. A second condensing portion 44 horizontally extends from an end of the second connecting portion 45 and extends towards the first connecting portion 47. The second condensing portion 44, the second connecting portion 45 and the evaporating portion 42 cooperatively form another U-shaped configuration, which has an opening oriented towards a second direction opposite to the first direction.

Figure 3:
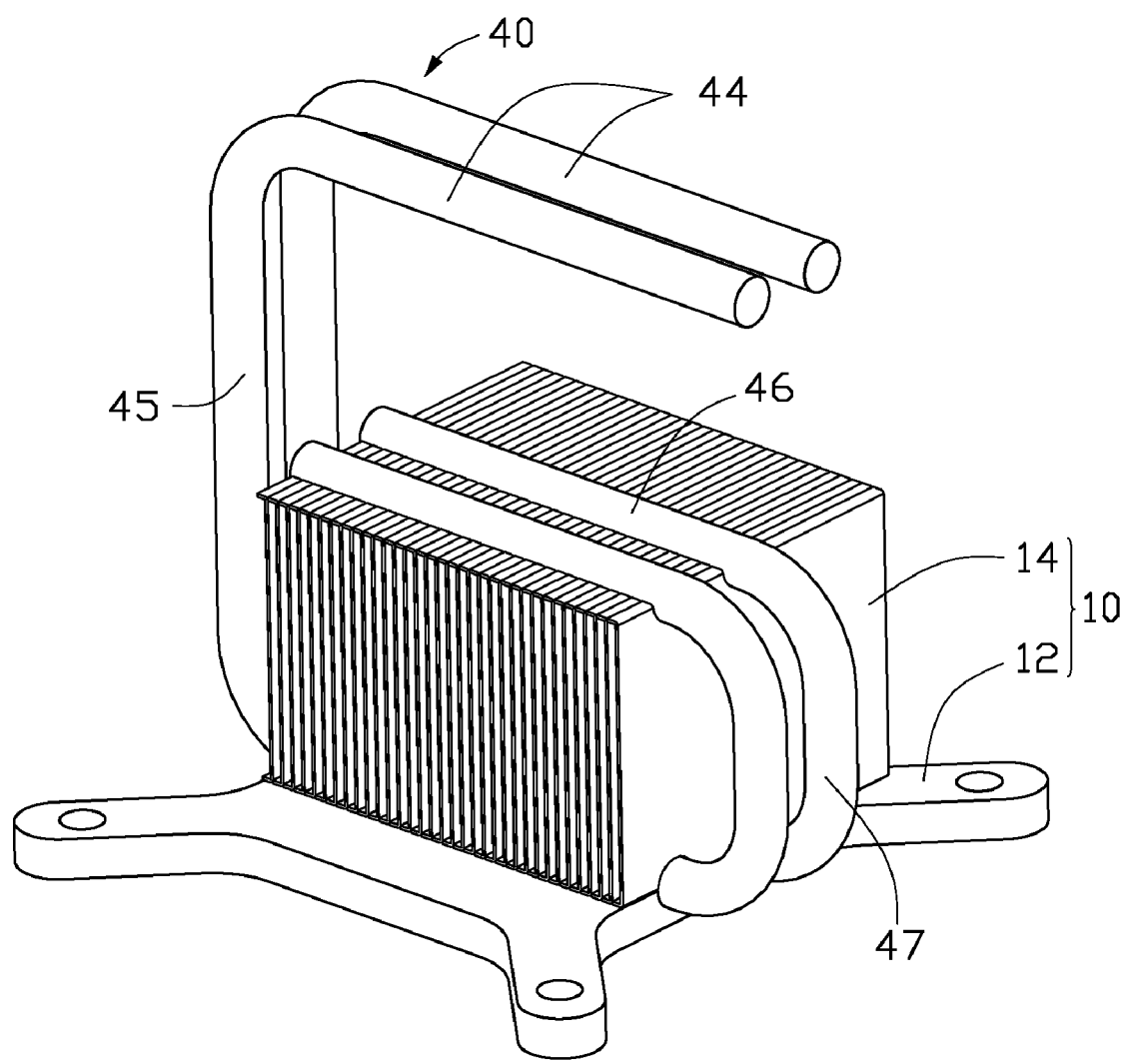
FIG. 3 is a partially assembled, isometric view of the heat dissipation device in FIG. 2.
Figure 4:
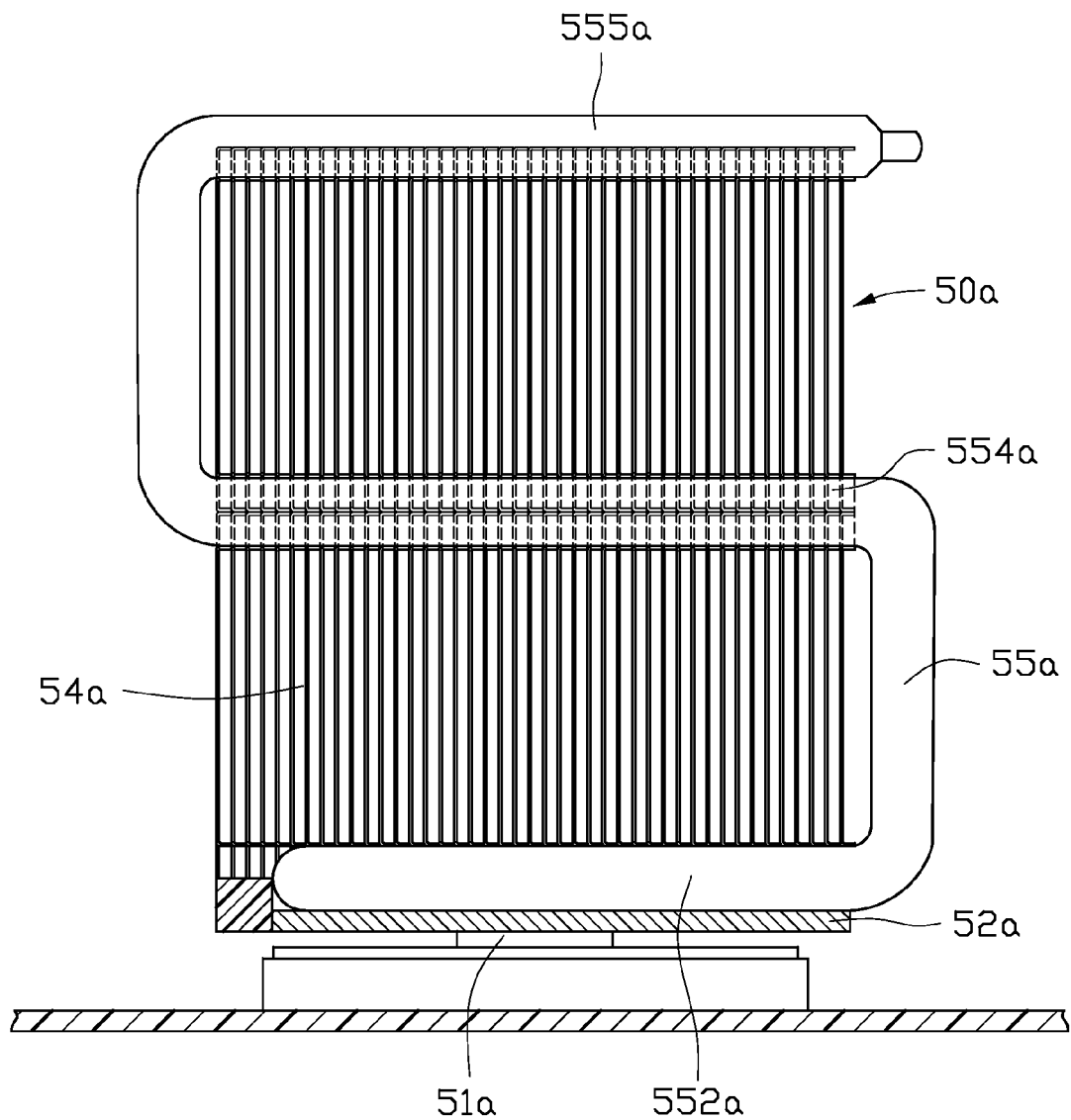
FIG. 4 is an assembled view of a related heat dissipation device.

Referring to FIG. 3, in assembly, firstly the evaporating portions 42 of the two heat pipes 40 are received in the grooves 122 of the bottom board 12.

Secondly, free ends of the two first condensing portions 46 of the heat pipes 40 are pulled up to expand an area enclosed by the first condensing portions 46, the evaporating portions 42 and the connecting portions 47 so that the fins 14 can be installed in the area from a front or rear side of the heat pipes 40 to a position wherein the grooves 146 correspond to the evaporating portions 42 and the grooves 144 correspond to the first condensing portions 46. Then, once released the first condensing portions 46 are received in the grooves 144 and press downward thus holding the fins 14 in place.

Thirdly, the bottom portion of the heat spreader 30 is positioned covering the top portion 143 of the fins 14 with the grooves 302 aligning with the first condensing portions 46 of the heat pipes 40.

Fourthly, the grooves 224 of the fins 22 are aligned with the corresponding second condensing portions 44 of the two heat pipes 40. At the same time the fins 22 are moved inwardly along an reverse extension direction of the second condensing portions 44, i.e., the first direction, until the fins 22 are received in an area, which is enclosed by the second condensing portions 44, the first condensing portions 46 and a part of the second connecting portions 45 of the heat pipes 40. Meanwhile, a bottom portion 220 of the fins 22 is attached to the heat spreader 30 and the second condensing portions 44 are received in the grooves 224 of the fins 22.

Finally, the cover board 24 is attached to the top portion 223 of the fins 22 with the grooves 242 aligning with the corresponding second condensing portions 44 of the heat pipes 40. In this way the assembly of the heat dissipation device is completed.

In the assembled heat dissipation device, the evaporating portions 42 of the heat pipes 40 are received in the passage formed by the grooves 122, 146 to thermally contact with the bottom board 12 and the fins 14. The second condensing portions 44 are received in the passage formed by the grooves 224, 242 to thermally contact with the fins 22 and the cover board 24. The first condensing portions 46 are received in the passage formed by the grooves 144, 302 to thermally contact with the fins 14 and the heat spreader 30. The connecting portions 45, 47 of the heat pipes 40 are positioned in two lateral sides of the heat sinks 10, 20. In other words, the heat pipes 40 surround an entire periphery of the fins 14, meanwhile, the heat pipes 40 surround roughly half of the periphery of the fins 22.

In operation, heat produced by the electronic device is firstly absorbed by the bottom board 12, then a part of heat of the bottom board 12 is directly conducted to the fins 14 of the first heat sink 10, and then gradually to the heat spreader 30 and the second heat sink 20. Another part of the heat of the bottom board 12 is conducted to the evaporating portions 42 of the heat pipes 40. Then, the heat absorbed by the evaporating portions 42 is transferred upwardly to the second condensing portions 44 and the first condensing portions 46 along the connecting portions 45, 47, which are located on opposite lateral sides of the first and second heat sinks 10, 20. As the second condensing portions 44 thermally contact with the fins 22 and the cover board 24, and the first condensing portions 46 thermally contact with the fins 14 and the heat spreader 30, the heat absorbed by the heat pipes 40 can be quickly conducted to the fins 14, the heat spreader 30, the fins 22 and the cover board 24 via the condensing portions 44, 46. Thus, the heat dissipation device has high heat dissipation efficiency.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
    a first heat sink adapted for thermally contacting with an electronic device;
    a second heat sink mounted on the first heat sink;
    at least one heat pipe connecting with both the first heat sink and the second heat sink, wherein
    the at least one heat pipe surrounds an entire periphery of the first heat sink and comprises an evaporating portion, a first condensing portion and a second condensing portion, wherein, the first condensing portion and the second condensing portion extend from two opposite ends of the evaporating portion respectively, the evaporating portion is positioned adjacent to the electronic device, the two condensing portions extend inwardly and bend in opposite directions to each other, the first condensing portion extends through the first heat sink, the second condensing portion extends through the second heat sink.

2. The heat dissipation device as claimed in claim 1, wherein a heat spreader is located between the first heat sink and the second heat sink.

3. The heat dissipation device as claimed in claim 2, wherein the first heat sink comprises a plurality of fins and a bottom board under the fins, the second heat sink comprises a plurality of fins and a cover board above the fins of the second heat sink.

4. The heat dissipation device as claimed in claim 3, wherein the evaporating portion of the at least one heat pipe is sandwiched between the fins of the first heat sink and the bottom board, the first condensing portion of the at least one heat pipe is sandwiched between the first heat sink and the heat spreader, the second condensing portion of the at least one heat pipe is sandwiched between the fins of the second heat sink and the cover board.

5. The heat dissipation device as claimed in claim 3, wherein a bottom portion of the fins of the first heat sink is thermally connected to a top portion of the bottom board by soldering, a top portion of the fins of the first heat sink is thermally connected with a bottom portion of the heat spreader by soldering, a top portion of the heat spreader is thermally connected with a bottom portion of the fins of the second heat sink by soldering, a top portion of the fins of the second heat sink is thermally connected with a bottom portion of the cover board by soldering.

6. The heat dissipation device as claimed in claim 1, wherein the at least one heat pipe further comprises a first connecting portion and a second connecting portion positioned between the evaporating portion and each of the condensing portions.

7. The heat dissipation device as claimed in claim 6, wherein the first condensing portion extends from an end of the first connecting portion towards the second connecting portion.

8. The heat dissipation device as claimed in claim 6, wherein the second condensing portion extends from an end of the second connecting portion towards the first connecting portion.

9. The heat dissipation device as claimed in claim 6, wherein the first connecting portion perpendicularly connects the evaporating portion and the first condensing portion, the second connecting portion perpendicularly connects the evaporating portion and the second connecting portion.

10. The heat dissipation device as claimed in claim 6, wherein the second connecting portion is longer than the first connecting portion.

11. The heat dissipation device as claimed in claim 5, wherein the two connecting portions are positioned in two lateral sides of the first and second heat sinks respectively.

12. A heat dissipation device comprising:
a first heat sink;
a second heat sink stacked on the first heat sink;
at least one heat pipe connecting with the first heat sink and the second heat sink, the at least one heat pipe defining a first U-shaped configuration and a second U-shaped configuration, which are oriented in different directions, the first U-shaped configuration being located within the second U-shaped configuration.

13. The heat dissipation device as claimed in claim 12, wherein the at least one heat pipe comprises an evaporating portion, a first connecting portion and a second connecting portion, the first and second connecting portions extending upwardly from two ends of the evaporating portion.

14. The heat dissipation device as claimed in claim 13, wherein a first condensing portion extends from an end of the first connecting portion and towards the second connecting portion, the first condensing portion, the first connecting portion and the evaporating portion cooperatively form the first U-shaped configuration, which has an opening oriented in a first direction.

15. The heat dissipation device as claimed in claim 14, wherein a second condensing portion extends from an end of the second connecting portion and extends towards the first connecting portion, the second condensing portion, the second connecting portion and the evaporating portion cooperatively form the second U-shaped configuration, which has an opening oriented in a second direction opposite to the first direction.

16. The heat dissipation device as claimed in claim 14, wherein the first condensing portion extends through the first heat sink.

17. The heat dissipation device as claimed in claim 16, wherein the second condensing portion extends through the second heat sink.

* * * * *